United States Patent [19]

Kita et al.

[11] Patent Number: 4,500,625
[45] Date of Patent: Feb. 19, 1985

[54] DEVELOPER FOR LIGHT-SENSITIVE LITHOGRAPHIC PRINTING PLATE PRECURSOR

[75] Inventors: Nobuyuki Kita; Hiroshi Matsumoto; Hitoshi Hagiwara, all of Shizuoka, Japan

[73] Assignee: Fuji Photo Film Co., Ltd., Kanagawa, Japan

[21] Appl. No.: 548,808

[22] Filed: Nov. 4, 1983

[30] Foreign Application Priority Data

Nov. 5, 1982 [JP] Japan ................................ 57-194203

[51] Int. Cl.$^3$ ........................ G03C 5/24; G03C 5/00; G03F 7/08
[52] U.S. Cl. .................................. 430/149; 430/302; 430/309; 430/331
[58] Field of Search ................ 430/331, 309, 302, 149

[56] References Cited

U.S. PATENT DOCUMENTS

| | | | |
|---|---|---|---|
| 2,223,949 | 12/1940 | Bremer | 260/462 |
| 2,224,011 | 12/1940 | Bremer | 260/462 |
| 3,755,408 | 8/1973 | Cuneo | 260/462 R |
| 4,259,434 | 3/1981 | Yamasue et al. | 430/302 |
| 4,356,254 | 10/1982 | Takahashi et al. | 430/165 |
| 4,436,807 | 3/1984 | Walls | 430/331 |

FOREIGN PATENT DOCUMENTS 1145190  4/1983  Canada ................................ 430/302
2625336  12/1976  Fed. Rep. of Germany ...... 430/302

Primary Examiner—John E. Kittle
Assistant Examiner—Mukund J. Shah
Attorney, Agent, or Firm—Sughrue, Mion, Zinn, Macpeak & Seas

[57] ABSTRACT

A developer for a light-sensitive lithographic printing plate having an o-quinonediazide-containing light-sensitive layer is disclosed. The developer is comprised of an aqueous solution of an alkali silicate containing an organic boron compound. The organic boron compound is represented by the formula

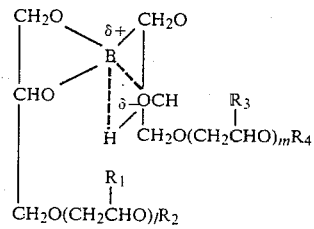

the substituents are defined within the specification. By utilizing the developer of the invention it is possible to provide excellent developing power, development stability, processability and preferred forming properties during development.

8 Claims, No Drawings

DEVELOPER FOR LIGHT-SENSITIVE LITHOGRAPHIC PRINTING PLATE PRECURSOR

FIELD OF THE INVENTION

This invention relates to an improved developer for light sensitive lithographic printing plate precursors having an o-quinonediazide compound as a light-sensitive component.

BACKGROUND OF THE INVENTION

It is known that an o-quinonediazide compound decomposes, upon the irradiation of actinic light, and the diazo group thereof forms a compound having a carboxy group. Therefore, when a light-sensitive layer containing an o-quinonediazide compound is processed by an alkaline developer after image exposure, the exposed portion is removed and the unexposed portion forms an image. Thus, an o-quinonediazide compound is very frequently used as a so-called positive working light-sensitive component, in particular, recently for a light-sensitive layer of a light-sensitive lithographic printing plate precursor or a photoresist composition for etching. In particular, a composition composed of a mixture of an o-quinonediazide compound and an alkali-soluble resin is advantageously used from both economical and practical points of view and a mixture of an o-quinonediazide compound and a novolak-type phenol-formaldehyde condensation resin or cresol-formaldehyde condensation resin is most generally used.

Developers for such an o-quinonediazide-containing light-sensitive layer include an aqueous solution containing sodium tertiary phosphate, sodium hydroxide, sodium silicate, potassium silicate, ammonium silicate, etc., which may be used solely or as a mixture. However, an aqueous solution of sodium hydroxide, sodium tertiary phosphate, etc., is inconvenient as a developer for a light-sensitive lithographic printing plate precursor using a metal support when requiring a considerably long developing time since such a solution shows a strong etching action on metal such as aluminum. Furthermore, when using such a developer the result of development is liable to greatly fluctuate and in an extreme case the image formed is frequently removed even by a light excess of the developing time. Moreover, when such a developer is used, reduction in developing faculty due to repeated use is severe and the number (processability) of light-sensitive lithographic printing plate precursors capable of being processed by a definite volume of the developer is very small.

Therefore, recently, an aqueous solution of sodium silicate or potassium silicate has been relatively advantageously used. This is because the solution has weak etching action to a metal such as aluminum and also the developing property of the developer can be controlled to some extent according to the component ratio of silicon oxide ($SiO_2$) to sodium oxide ($Na_2O$) or potassium oxide ($K_2O$) (generally shown by mol ratio of $SiO_2/Na_2O$ or $SiO_2/K_2O$ which are the components of sodium silicate or potassium silicate, and the concentrations of them. That is, as the content of $SiO_2$ increases, the developing power is restrained to increase the development stability and as the content of $Na_2O$ or $K_2O$ is increased, the developing power is increased to reduce the development stability. The term "development stability" means the stability of images to a development time and if the content of $Na_2O$ or $K_2O$ is increased, the image is liable to be removed in a short period of time.

It is preferable that the processability by a definite volume of a developer is higher as the content of $Na_2O$ or $K_2O$ is larger. Accordingly, by increasing the total concentrations of $SiO_2$ and $Na_2O$ or $K_2O$ while controlling the $SiO_2/Na_2O$ ratio or the $SiO_2/K_2O$ ratio from the aspects of developing power and development stability, a desired processability can be obtained to some extent together with desired developing power and development stability. However, a conventional developer is insufficient with respect to all of the foregoing properties. For example, a developer having a standard developing power tends to lack stability and a developer having a standard stability tends to lack developing power and processability. Also, a conventional developer of this type is not desirable in that since the concentration of the developer is relatively high, the developer is liable to form precipitates and also a large amount of an acid is required for neutralizing the waste solution after use.

The foregoing problems on the developers containing sodium hydroxide, sodium tertiary phosphate, sodium silicate, potassium silicate, etc., are summarized as follows. That is, if the alkalinity of the developer is increased, the developer is superior in developing power and processability but is lacking in development stability and for obtaining high development stability, the alkali concentration must be reduced, which results in reducing the processability of the developer. Accordingly, if a high development stability can be obtained in a state that the developer has a high alkalinity, a developer having excellent developing power, processability, and development stability can be obtained.

As a method of obtaining a high development stability in the state of high alkalinity, a method of adding an anionic surface active agent or an amphoteric surface active agent to a developer is described in Japanese Patent Application (OPI) No. 51,324/'75 (the term "OPI" indicates an unexamined published patent application open to public inspection), a method of adding a water-soluble cationic polymer to a developer is described in Japanese Patent Application (OPI) No. 95,946/'80 and also a method of adding a water-soluble amphoteric high molecular electrolyte to a developer is described in Japanese Patent Application (OPI) No. 142528/'81. However, when these developers are used in an automatic developing machine, they cause undesirable foaming during development.

Also, it is described in Japanese Patent Application (OPI) No. 25,100/'80 corresponding to Canadian Pat. No. 1,145,190 that an ionic compound of a transition element belonging to Groups IIA, IIIA, and IIIb of the periodic table is added to a developer. Such a developer may have an effect of restraining etching of an anodically oxidized aluminum support by a strong alkali but has insufficient development stability.

SUMMARY OF THE INVENTION

A primary object of this invention is to provide a developer excellent in developing power, development stability, processability, foaming property, etc.

As the result of various investigations on attaining the foregoing, the inventors have discovered that an improved developer for an o-quinonediazide-containing light-sensitive layer is obtained by incorporating a water-soluble organic boron compound represented by the following general formula to an aqueous solution of an alkali silicate;

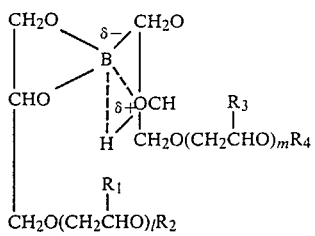

wherein $R_1$ and $R_3$, which may be the same or different, each represents H or $CH_3$; $R_2$ and $R_4$, which may be the same or different, each represents H, $COR_5$, or $CONHR_6$ (wherein, $R_5$ and $R_6$ each represents an alkyl group, an aryl group, an alkenyl group, or an alkynyl group); and l and m each represents an integer of 1 to 100.

DESCRIPTION OF THE PREFERRED EMBODIMENT

As an alkali silicate used in this invention, there are sodium silicate, potassium silicate, lithium silicate, ammonium silicate, etc., and they may be used solely or as a combination of them. The $SiO_2/M_2O$ mol ratio (wherein, M represents an alkali metal) of the alkali silicate is preferably 0.5 to 3.0, more preferably 1.0 to 2.0. As the foregoing mole ratio is over 3.0, its developing property tends to be decreased. Also, as the foregoing mol ratio becomes smaller than 0.5, the alkalinity of the developer becomes higher. This high alkalinity can cause the developer to etch a metal such as an aluminum plate which is usually used as a support for light-sensitive lithographic printing plate precursors.

It is preferred that the concentration of the alkali silicate in the developer be 1 to 10% by weight, in particular, 1.5 to 7% by weight. If the concentration of the alkali silicate is higher than 10% by weight, the developer is liable to form precipitates or crystals and also at the neutralization of the waste developer, the developer is liable to be gelled, whereby processing work of the waste solution becomes troublesome. On the other hand, if the concentration is lower than 1% by weight, the developing power and the processability of the developer are lowered.

The most characteristic component used in the developer of this invention is the water-soluble organic boron compound shown by the general formula described before.

Examples of the Alkyl group shown by $R_5$ and $R_6$ in the general formula are preferably straight or branched chain alkyl groups having 1 to 26 carbon atoms, such as

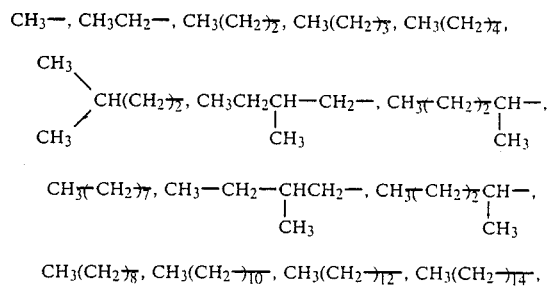

-continued
$CH_3(CH_2)_{16}-$, $CH_3(CH_2)_{18}-$, $CH_3(CH_2)_{20}-$, $CH_3(CH_2)_{22}-$, $CH_3(CH_2)_{24}-$, etc.

Also, examples of the aryl group shown by $R_5$ and $R_6$ include monocyclic or dicyclic aryl groups and such aryl groups having a straight or branched chain alkyl group having preferably 1 to 21 carbon atoms, more preferably 1 to 12 carbon atoms as a substituent. The preferable aryl groups include a phenyl group,

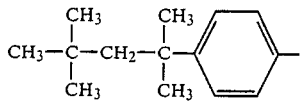

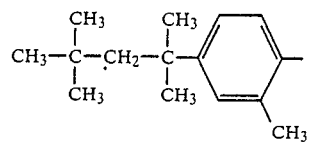

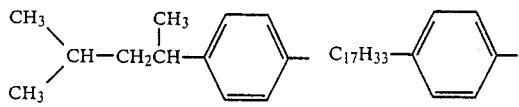

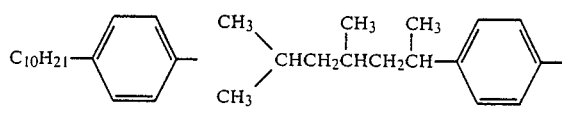

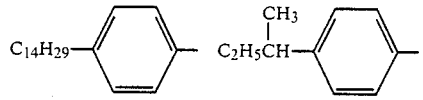

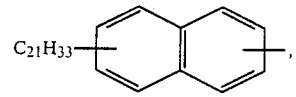

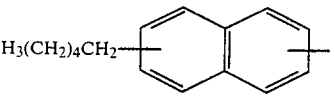

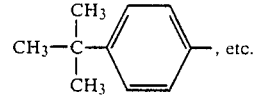
, etc.

Furthermore, examples of the alkenyl group or the alkynyl group shown by $R_5$ and $R_6$ are the alkenyl or alkynyl groups having 10 to 24 carbon atoms, such as $CH_2=CH(CH_2)_7$, $CH_3CH_2CH=CH(CH_2)_7$, $CH_3(CH_2)_5CH=CH-$, $CH_3(CH_2)_7CH=CH-CH_3(CH_2)_5C-H(OH)CH_2CH_2CH=CH(CH_2)_7$, $CH_3(CH_2)_{10}CH=CH(CH_2)_4$, $CH_3(CH_2)_5CH=CH(CH_2)_9$, $CH_3(CH_2)_4CH=CHCH_2CH=CH(CH_2)_7$, $CH_3CH_2CH=CHCH_2CH=CHCH_2CH=CH(CH_2)_7$, $CH_3(CH_2)_3(CH=CH)_3(CH_2)_7$, $CH_3(CH_2)_7C\equiv(CH_2)_7$, $CH_3(CH_2)_9CH=CH(CH_2)_7$, etc.

The production processes of these organic boron compounds are described in, for example, the product catalogues for Emulbon, trade name by Toho Kagaku Kogyo K.K. Also, these organic boron compounds are described in, for example, Japanese Patent Publication Nos. 24,043/'67; 14,322/'68 and 18,380/'68 and U.S. Pat. Nos. 2,224,011 and 2,223,949 (incorporated herein by reference to disclose such processor).

These water soluble organic boron compounds used in this invention can provide the effects of this invention in a wide addition amount range but a proper addition amount is 0.001 to 3% by weight, more preferably 0.0001 to 0.3% by weight, most preferably 0.003 to 0.1% by weight based on the amount of the developer.

The O-quinonediazide-containing light-sensitive layer to which the developer of this invention is applied is a light-sensitive duplicating layer containing as the light-sensitive component an o-quinonediazide compound which increases an alkali solubility by the irradiation of actinic light.

The positive working presensitized plate to which the developing solution of the invention is applied comprises basically of an aluminum plate and a light-sensitive layer of an o-quinonediazide formed thereon. Suitable aluminum supports include a pure aluminum plate and aluminum alloy plates. Plastic films having aluminum laminated or vacuume-deposited thereon can also be used. Preferably, the surface of the aluminum plate is pre-treated by various methods, for example, by graining, dipping in an aqueous solution of sodium silicate, potassium fluorozirconate or a phosphate, or by anodic oxidation. An aluminum plate which has been grained and then dipped in an aqueous solution of sodium silicate as disclosed in U.S. Pat. No. 3,181,461 and an aluminum plate which has been anodically oxidized and then dipped in an aqueous solution of sodium silicate can also be used conveniently. The anodic oxidation can be effected, for example, by passing a current in an electrolytic solution consisting of at least one aqueous solution or non-aqueous solution of an inorganic acid such as phosphoric acid, chromic acid, sulfuric acid or boric acid, or an organic acid such as oxalic acid or sulfamic acid, or a salt thereof using an aluminum plate as an anode. Electrodeposition of silicate disclosed in U.S. Pat. No. 3,658,662 is also effective.

An aluminum support which has been electrolytically grained as disclosed in U.S. Pat. No. 4,087,341, Japanese Patent Publication No. 27481/71, and Japanese Laid-Open Patent Publication No. 30503/72 and then anodically oxidized as described above is also useful. Another suitable support is an aluminum plate support obtained by graining an aluminum support as described in U.S. Pat. No. 3,834,998, chemically etching it, and then anodically oxidizing it. Such hydrophilizing treatments are carried out not only for the purpose of rendering the surface of the support hydrophilic, but also for the purpose of preventing an undesirable reaction with a light-sensitive composition to be coated thereon and increasing the adhesion of the support to the light-sensitive layer.

The light-sensitive layer formed on the hydrophilic surface of the support contains an o-quinonediazide compound. An especially preferred o-quinonediazide compound is an o-naphthoquinonediazide compound. Such compounds are described in a number of publications including U.S. Pat. Nos. 3,046,110, 3,046,111, 3,046,121, 3,046,115, 3,046,118, 3,046,119, 3,046,120, 3,046,121, 3,046,122, 3,046,123, 3,061,430, 3,102,809, 3,106,465, 3,635,709 and 3,647,443, and can also be used conveniently in the present invention. Preferred o-naphthoquinonediazide compounds are o-naphthoquinonediazide sulfonic acid esters or o-naphthoquinonediazide carboxylic acid esters of aromatic hydroxy compounds, and o-naphthoquinonediazide sulfonic acid amides or o-naphthoquinonediazide carboxylic acid amides of aromatic amino compounds. In particular, the product obtained by the ester-forming reaction of a condensate between pyrogallol and acetone with o-naphthoquinonediazide sulfonic acid which is described in U.S. Pat. No. 3,635,709; the product obtained by the ester-forming reaction of a hydroxy-terminated polyester with o-naphthoquinonediazide sulfonic acid or o-naphthoquinonediazide carboxylic acid which is described in U.S. Pat. No. 4,028,111: the product obtained by an ester-forming reaction of a homopolymer of p-hydroxystyrene or a copolymer of p-hydroxystyrene with another copolymerizable monomer with o-naphthoquinonediazide carboxylic acid which is described in British Pat. No. 1,494,043; and the product obtained by the amide-forming reaction of a copolymer of p-aminostyrene with another copolymerizable monomer with o-naphthoquinonediazide sulfonic acid or o-naphthoquinonediazide carboxylic acid which is described in U.S. Pat. No. 3,759,711 are preferred.

Although these o-quinonediazide compounds can be used alone, it is preferable to mix an o-quinonediazide compound with an alkali-soluble resin, and use the mixture as a light-sensitive layer. Suitable alkali-soluble resins include a styrene-maleic anhydride copolymer and novolac-type phenolic resins, specifically a phenol-formaldehyde resin, an o-cresol-formaldehyde resin, and an m-cresol-formaldehyde resin. Furthermore, as disclosed in U.S. Pat. No. 4,123,279, the use of a mixture of the above-exemplified phenolic resin with a condensate of phenol or cresol substituted by an alkyl group having 3 to 8 carbon atoms and formaldehyde, such as a t-butylphenol-formaldehyde resin, is more preferred. The amount of the alkali-soluble resin is about 50 to about 85% by weight, preferably 60 to 80% by weight, based on the weight of the light-sensitive layer, the balance of the layer being o-quinonediazide compound.

If desired, the light-sensitive layer comprising the o-quinonediazide compound may further contain additives, such as dyes, plasticizers, and ingredients which give printout properties. These materials are well known in the art and their discussion below should not be considered as limiting.

Dyes are used to give the image area contrast from the non-image area (the surface of the support) after the exposure and development of a presensitized plate. Preferred dyes are alcohol-soluble dyes, such as C.I. 26, 105 (Oil Red RR), C.I. 21, 260 (Oil Scarlet #308), C.I. 74, 350 (Oil Blue), C.I. 52, 015 (Methylene Blue), and C.I. 42, 555 (Crystal Violet). Such a dye is added in an amount sufficient to give a clear contrast between the color of the hydrophilic surface of the uncovered support and the color of the remainder of the light-sensitive layer. Generally, the suitable amount of the dye is not more than about 7% by weight based on the total amount of the light-sensitive composition.

Plasticizers are desirably used to impart flexibility to the light-sensitive layer formed on the support. Examples of effective plasticizers for use in the invention include phthalate esters such as dimethyl phthalate, diethyl phthalate, dibutyl phthalate, diisobutyl phthalate, dioctyl phthalate, octyl capryl phthalate, dicyclohexyl phthalate, di(tridecyl) phthalate, butyl benzyl phthalate, diisodecyl phthalate, diallyl phthalate; glycol esters such as dimethyl glycol phthalate, ethylphthallyl ethyl glycolate, methyl phthallyl ethyl glycolate, butyl phthallyl butyl glycolate and triethylene glycol dicaprylate; phosphate esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate; triethyl citrate; glycerin triacetyl ester; and butyl laurate. The amount of the plasticizer is not more than about 5% by weight based on the total amount of the light-sensitive composition.

A print-out material is added to permit viewing of a visible image immediately upon the imagewise exposure of the light-sensitive layer of a presensitized plate. It includes, for example, the pH indicator disclosed in British Patent Publication No. 1,041,463, the combination of o-naphthoquinonediazide-4-sulfonyl chloride and a dye which is disclosed in U.S. Pat. No. 3,969,118, and the photochromic compound disclosed in Japanese Patent Publication No. 6413/69. Furthermore, as stated in U.S. Pat. No. 4,115,128, a cyclic acid anhydride may be incorporated into the light-sensitive layer to increase its sensitivity.

The light-sensitive composition composed of the o-naphthoquinonediazide is coated on a support from solution in a suitable solvent. Suitable solvents include, for example, glycol ethers such as ethylene glycol monomethyl ether, ethylene glycol monoethyl ether and 2-methoxyethyl acetate, ketones such as acetone, methyl ethyl ketone and cyclohexanone, and chlorinated hydrocarbons such as ethylene dichloride.

The amount of the light-sensitive layer composed of the O-quinonediazide compound formed on the support is about 0.5 to about 7 $g/m^2$, preferably 1.5 to 3 $g/m^3$.

When the resulting positive working presensitized plate is exposed to an abundance of actinic light from a carbon arc lamp, mercury lamp, metal halide lamp, xenon lamp or tungsten lamp through an image-bearing transparency, the exposed portion turns alkali-soluble. Accordingly, the exposed portion of the of the light-sensitive layer is washed away with an alkaline aqueous solution to reveal the hydrophilic surface of the support.

By applying the developer of this invention to these light-sensitive materials, the following merits are obtained.

Firstly, the development stability is increased to greatly facilitate the management or control of the developing conditions. Secondly, the processability is increased and many light-sensitive materials can be developed using a relatively small amount of the developer. Thirdly, the discharging amount of the used developer may be small, which facilitates the disposal of the waste solution.

Then, the invention will now be further explained more practically by the following examples. However, the scope of the invention is not limited to these examples.

EXAMPLES 1 to 4

A light-sensitive liquid was prepared by dissolving 0.8 part by weight of a naphthoquinone-1,2-diazido-5-sulfonic acid ester of polyhydroxyphenyl obtained by the condensate of acetone and pyrogallol described in Example 1 of Japanese Patent Publication No. 28,403/'78, 2.2 parts by weight of a novolak-type meta-para mixed cresol-formaldehyde resin, 0.02 part by weight of a novolak-type octylphenolformaldehyde resin, 0.08 part by weight phthalic anhydride, 0.04 part by weight of 2-trichloromethyl-5-(p-methoxystyryl)-1,3,4-oxadiazole, and 0.03 part by weight of p-toluenesulfonate of Crystal Violet in a mixture of 20 parts by weight of methylcellosolve acetate and 8 parts by weight of methyl ethyl ketone.

An aluminum plate having 0.3 mm in thickness and grained by a nylon brush was etched with an alkali, further electrolytically etched in an aqueous nitric acid solution, anodically oxidized in an aqueous sulfuric acid solution (the amount of the anodically oxidized layer was 2.7 $g/m^2$), treated in an aqueous solution of zinc acetate at 70° C. followed by thorough washing, and then dried.

The foregoing light-sensitive liquid was coated on the aluminum plate thus treated by means of a whirler and dried to provide a light-sensitive plate having a light-sensitive layer of a coverage of about 2.0 $g/m^2$. The light-sensitive plate was exposed through a step wedge having a density difference of 0.15 and a dot wedge using a PS light (a metal halide lamp of 2 KW) made by Fuji Photo Film Co., Ltd.

A developer was prepared by adding the compound shown in Table 1 to one liter of an aqueous solution of 2% by weight sodium silicate having a $SiO_2/Na_2O$ mol ratio of about 1.1.

TABLE 1

| | Additive | g/l |
|---|---|---|
| Example | | |
| 1 | (structure: B with CH$_2$O, OCH$_2$, CHO, OCH, H, CH$_2$O(C$_2$H$_4$O)$_m$H, CH$_2$O(C$_2$H$_4$O)$_l$H) 0.005 part by wt. l + m = 40 | + sodium ethylenediaminetetracetate.4H$_2$O 0.1 part by weight |
| 2 | (structure: B with CH$_2$O, OCH$_2$, CHO, OCH, H, CH$_2$O(C$_2$H$_4$O)$_m$COC$_{12}$H$_{25}$, CH$_2$O(C$_2$H$_4$O)$_l$H) 0.01 part by wt. l + m = 40 | |
| 3 | (structure: B with CH$_2$O, OCH$_2$, CHO, OCH, H, CH$_2$O(C$_2$H$_4$O)$_m$COC$_{18}$H$_{35}$, CH$_2$O(C$_2$H$_4$O)$_l$COC$_{18}$H$_{35}$) 0.03 part by wt. l + m = 40 | |
| 4 | (structure: B with CH$_2$O, OCH$_2$, CHO, OCH, H, CH$_2$O(C$_2$H$_4$O)a'(C$_3$H$_6$O)b'H, CH$_2$O(C$_2$H$_4$O)a(C$_3$H$_6$O)bH) 0.05 part by wt. a + a' = 30, b + b' = 10 | |
| Comparison exam- | None | |

TABLE 1-continued

| Additive | g/l |
|---|---|
| ple 1 | |

Two such exposed light-sensitive plates as described above were prepared, immersed in each of the developers kept at 25° C., the one was withdrawn after one minute and the other after 5 minutes, and they were washed with water. The results of the dissolving out step number of the step wedge and the dot reproducibility of the highlight portion of the dot wedge are show in Table 2.

TABLE 2

| | Step no. of step wedge | | |
|---|---|---|---|
| | 1 min. development | 5 min. development | Dot wedge |
| Example | | | |
| 1 | 4 | 5 | 150 lines/inch, 2% dot reproduced after 5 min. |
| 2 | 3 | 4 | 150 lines/inch, 2% dot reproduced after 5 min. |
| 3 | 3 | 4 | 150 lines/inch, 2% dot reproduced after 5 min. |
| 4 | 4 | 4 | 150 lines/inch, 2% dot reproduced after 5 min. |
| Comparison Example | | | |
| 1 | 6 | 13 | 150 lines/inch, 2% dot vanished after 5 min. |

From the results shown in Table 2, it can be understood that the developers of Examples 1 to 4 show very stable developing properties as compared with the developer of Comparison example 1 composed of an aqueous sodium silicate alone.

Furthermore, the result of determining the developing processability of the developers of Examples 1 and 2 showed that each developer maintained a sufficient developing power after developing the light-sensitive plate of 3 m² per liter.

EXAMPLES 5 to 8

A light-sensitive plate having the same consturiction as in Example 1 was prepared and developed by the same manner as in Example 1 using a developer prepared by adding the compound shown in Table 3 to one liter of an aqueous solution of 2.5% by weight potassium silicate having a $SiO_2/K_2O$ mol ratio of 1.2. The results are shown in Table 4.

TABLE 1

| | Additive | g/l |
|---|---|---|
| Example | | |
| 5 | $CH_2O \diagdown_{\delta-} OCH_2$<br>$\phantom{CHO}B$<br>$CHO \diagup^{\phantom{i}}\diagdown OCH$<br>$\phantom{CHO H}{}_{\delta+} CH_2O(C_2H_4O)_mH$<br>$CH_2(C_2H_4O)_lH$<br>0.005 part by wt. l + m = 40 | + sodium ethylene-diamine-tetrace-tate.4H$_2$O<br><br>0.12 part by weight |
| 6 | $CH_2O \diagdown_{\delta-} OCH_2$<br>$\phantom{CHO}B$<br>$CHO \diagup^{\phantom{i}}\diagdown OCH$<br>$\phantom{CHO H}{}_{\delta+} CH_2O(C_2H_4O)_mCOC_{12}H_{25}$<br>$CH_2O(C_2H_4O)_lH$<br>0.01 part by wt. l + m = 40 | + sodium ethylene-diamine-tetrace-tate.4H$_2$O<br><br>0.12 part by weight |
| 7 | $CH_2O \diagdown_{\delta-} OCH_2$<br>$\phantom{CHO}B$<br>$CHO \diagup^{\phantom{i}}\diagdown OCH$<br>$\phantom{CHO H}{}_{\delta+} CH_2O(C_2H_4O)_mCOC_{18}H_{35}$<br>$CH_2O(C_2H_4O)_lCOC_{18}H_{35}$<br>0.03 part by wt. l + m = 40 | |
| 8 | $CH_2O \diagdown_{\delta-} OCH_2$<br>$\phantom{CHO}B$<br>$CHO \diagup^{\phantom{i}}\diagdown OCH$<br>$\phantom{CHO H}{}_{\delta+} CH_2O(C_2H_4O)a'(C_3H_6O)b'H$<br>$CH_2O(C_2H_4O)a(C_3H_6O)bH$<br>0.05 part by wt. a + a' = 30, b + b' = 10 | |
| Comparison example 2 | None | |

TABLE 4

| | Step no. of step wedge | | |
|---|---|---|---|
| | 1 min. development | 5 min. development | Dot wedge |
| Example | | | |
| 5 | 4 | 5 | 150 lines/inch, 2% dot reproduced after 5 min. |
| 6 | 3 | 4 | 150 lines/inch, 2% dot reproduced after 5 min. |
| 7 | 3 | 4 | 150 lines/inch, 2% dot reproduced after 5 min. |
| 8 | 3 | 4 | 150 lines/inch, 2% dot reproduced after 5 min. |
| Comparison example | | | |
| 2 | 7 | 14 | 150 lines/inches, 2% dot vanished after 5 min. |

From the result shown in Table 4, it is understood that the developers of Examples 5 to 8 showed very stable developing properties as compared with the developer in Comparison example 2 composed of an aqueous potassium silicate alone. Furthermore, the result of determining the developing processability of the developer of Example 6 showed that the developer maintained a sufficient developing power after developing the light-sensitive plate of 3 m² per liter.

When the waste solution of each of the developers of Examples 5 to 8 after processing was diluted with water and neutralized with hydrochloric acid, no formation of gel was observed and the neutralizing treatment could be easily applied to each waste solution.

EXAMPLE 9

By following the same development procedure as in Example 1 using a light-sensitive plate prepared by the same manner as in Example 1 except that a naphthoquinone-1,2-diazido-5-sulfonic acid ester of bisphenol A was used in place of the naphthoquinonediazide compound used in the example, the same results as in the case of Exaple 1 were obtained.

While the invention has been described in detail and with reference to specific embodiments thereof, it will be apparent to one skilled in the art that various changes and modifications can be made therein without departing from the spirit and scope thereof.

What is claimed is:

1. A developer for a light-sensitive lithographic printing plate having an o-quinonediazide-containing light-sensitive layer, comprising an aqueous solution;

the aqueous solution containing an alkali silicate containing an organic boron compound represented by the formula:

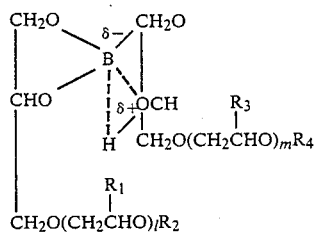

wherein $R_1$ and $R_3$, which may be the same or different, each represents H or $CH_3$; $R_2$ and $R_4$, which may be the same or different, each represents H, $COR_5$ and $CONHR_6$, $R_5$ and $R_6$ each represents an alkyl group, an aryl group, an alkenyl group, or an alkynyl group; and l and m each represents an integer of 1 to 100, wherein the organic boron compound is present in the developer in an amount in the range of 0.0001 to 3% by weight based on the weight of the developer.

2. A developer as claimed in claim 1, wherein the alkali silicate is selected from the group consisting of sodium silicate and potassium silicate.

3. A developer as claimed in claim 2, wherein the alkali silicate is represented by $SiO_2/M_2O$ wherein M is an alkali metal and the mol ratio of $SiO_2/M_2O$ is in the range of 0.5 to 3.0.

4. A developer as claimed in claim 3, wherein the $SiO_2/M_2O$ mol ratio is in the range of 1.0 to 2.0.

5. A developer as claimed in claim 2, wherein the alkali silicate is present in the developer in an amount in the range of 1 to 10% by weight.

6. A developer as claimed in claim 5, wherein the alkali silicate is present in the developer in an amount in the range of 1.5 to 7% by weight.

7. A developer as claimed in claim 1, wherein the organic boron compound is present in an amount in the range of 0.001 to 0.3% by weight.

8. A developer as claimed in claim 7 wherein the organic boron compound is present in an amount in the range of 0.003 to 0.1% by weight.

* * * * *